(12) United States Patent
Eberhardt et al.

(10) Patent No.: US 6,580,369 B1
(45) Date of Patent: Jun. 17, 2003

(54) ELECTRONIC TAG ASSEMBLY AND METHOD THEREFOR

(75) Inventors: Noel H. Eberhardt, Cupertino, CA (US); Sean Loving, Santa Clara, CA (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/515,174

(22) Filed: Feb. 29, 2000

(Under 37 CFR 1.47)

Related U.S. Application Data

(63) Continuation-in-part of application No. 09/061,146, filed on Apr. 16, 1998, which is a continuation-in-part of application No. 08/540,813, filed on Oct. 11, 1995, now abandoned.
(60) Provisional application No. 60/122,547, filed on Mar. 2, 1999.

(51) Int. Cl.⁷ ................................. G08B 13/14
(52) U.S. Cl. .................. 340/572.1; 340/572.7
(58) Field of Search .............. 340/572.1, 572.7, 340/572.8

(56) References Cited

U.S. PATENT DOCUMENTS

| | | | |
|---|---|---|---|
| 4,817,277 A | 4/1989 | Hieber et al. | |
| 4,876,535 A | 10/1989 | Ballmer et al. | |
| 4,910,499 A | 3/1990 | Benge et al. | |
| 5,162,613 A | 11/1992 | Schoenthaler | |
| 5,175,418 A | 12/1992 | Tanaka | |
| 5,258,577 A | 11/1993 | Clements | |
| 5,340,640 A * | 8/1994 | Bientz | 428/206 |
| 5,442,334 A | 8/1995 | Gallo et al. | |
| 5,528,222 A | 6/1996 | Moskowitz et al. | |
| 5,528,314 A | 6/1996 | Nagy et al. | |
| 5,566,441 A | 10/1996 | Marsh et al. | |
| 5,596,335 A | 1/1997 | Dishart et al. | |
| 5,645,707 A | 7/1997 | Omoto | |
| 5,670,966 A | 9/1997 | Dishart et al. | |
| 5,682,143 A | 10/1997 | Brady et al. | |
| 5,748,155 A | 5/1998 | Kandunce et al. | |
| 5,786,626 A | 7/1998 | Brady et al. | |
| 5,847,447 A | 12/1998 | Rozin et al. | |
| 5,850,187 A | 12/1998 | Carrender et al. | |
| 5,854,480 A | 12/1998 | Noto | |
| 5,883,599 A | 3/1999 | Hall | |
| 5,926,141 A | 7/1999 | Lindenmeier et al. | |
| 6,001,211 A | 12/1999 | Hiroyuki | |
| 6,043,782 A | 3/2000 | Dishart et al. | |
| 6,054,961 A | 4/2000 | Gong et al. | |
| 6,173,899 B1 | 1/2001 | Rozin | |
| 6,211,799 B1 | 4/2001 | Post et al. | |
| 6,365,500 B1 * | 4/2002 | Chang et al. | 438/614 |

\* cited by examiner

*Primary Examiner*—Thomas Mullen
(74) *Attorney, Agent, or Firm*—Andrew S. Fuller; Daniel K. Nichols; Terri S. Hughes

(57) ABSTRACT

An electronic tag assembly (100) includes a substrate (102) having an antenna pattern (104, 106) disposed thereon, an integrated circuit die (108) having electrical interface terminals (204, 206) that directly contact or interface with the antenna pattern (104, 106), and electrically non-conductive adhesive (202) interposed between the substrate and the integrated circuit die (108) that secures both together, and that maintains the integrity of the electrical interface. Preferably, a clamping force is exerted on the integrated circuit die (108) to maintain contact between the electrical terminals (204, 206) and the antenna pattern (104, 106) while the non-conductive adhesive (202) is being introduced.

6 Claims, 3 Drawing Sheets

US 6,580,369 B1

ELECTRONIC TAG ASSEMBLY AND METHOD THEREFOR

This application is a continuation-in-part of commonly-assigned prior U.S. patent application Ser. No. 09/061,146, filed Apr. 16, 1998 by Ted Geiszler et al., titled "Remotely Powered Electronic Tag with Plural Electrostatic Antennas and Associated Exciter/Reader," (now pending) which is a continuation-in-part of commonly-assigned prior U.S. patent application Ser. No. 08/540,813, filed Oct. 11, 1995 by Ted Geiszler et al., titled "Remotely Powered Electronic Tag with Plural Electrostatic Antennas and Associated Exciter/Reader and Related Method," (now abandoned) the disclosures of which prior applications are hereby incorporated by reference, verbatim and with the same effect as though it were fully and completely set forth herein.

CROSS REFERENCE TO RELATED APPLICATIONS

This application claims the benefit of U.S. Provisional Application No. 60/122,547, filed Mar. 2, 1999 and assigned to Motorola, Inc.

TECHNICAL FIELD

This invention relates in general to electronic assemblies, and in particular, to electronic tag assemblies that include the use of an integrated circuit part.

BACKGROUND OF INVENTION

In electronic applications, there is often a need to form assemblies that include an integrated circuit part and a carrier substrate, with an electrical connection therebetween. Oftentimes, an electrical interface is established between the integrated circuit die and the carrier substrate, by soldering, wire bonding, electroplating, or by anistropic conductive adhesive. Each of these prior art approaches has its own advantages and disadvantages including suitability for use with specific types of parts and manufacturing processes, assembly costs, and the like.

Anistropic conductive adhesives have gained in popularity because of certain identified advantages in the manufacturing process. A typical anistropic conductive adhesive contains metallic or other conductive particles which when compressed between electrical interfaces form a unidirectional electrical bond between the interfaces. Compression may be promoted by bumps or raised portions on one or more of the electrical interfaces. There are certain manufacturing difficulties involved when using conductive adhesives with small dimension parts. For example, the adhesive must be accurately applied so as to avoid short circuiting closely spaced terminals. Additionally, contact surfaces may need to be specially prepared to promote proper electrical connections. These and other costs disadvantages have limited the use of conductive adhesive for bonding integrated circuit dies to carrier substrates.

Electronic tag assemblies require a low-cost approach for attaching integrated circuit dies that is suitable for use in high-volume production. The integrated circuit die bonding approaches described in the prior art do not adequately address these needs. Therefore, an improved method for bonding an integrate circuit to form an assembly, such as an electronic tag assembly is needed.

DETAIL DESCRIPTION OF THE PREFERRED EMBODIMENT

The present invention provides for an electronic tag assembly suitable for use in high-volume, low-cost applications in which an integrated circuit die is bonded to a substrate using non-conductive adhesive. The integrated circuit die is placed on the substrate such that electrical terminals thereon contact an antenna in the form of a conductive pattern on the substrate. While maintaining contact between the electrical terminals and the conductive pattern, a non-conductive adhesive is introduced in between the circuit die and the substrate, to secure the integrated circuit die to the substrate, and to maintain contact between the electrical conductors and the conductive pattern. Preferably, a clamping force is exerted on the integrated circuit die to maintain contact between the electrical terminals and the conductive pattern while the non-conductive adhesive is being introduced.

Figure 1:
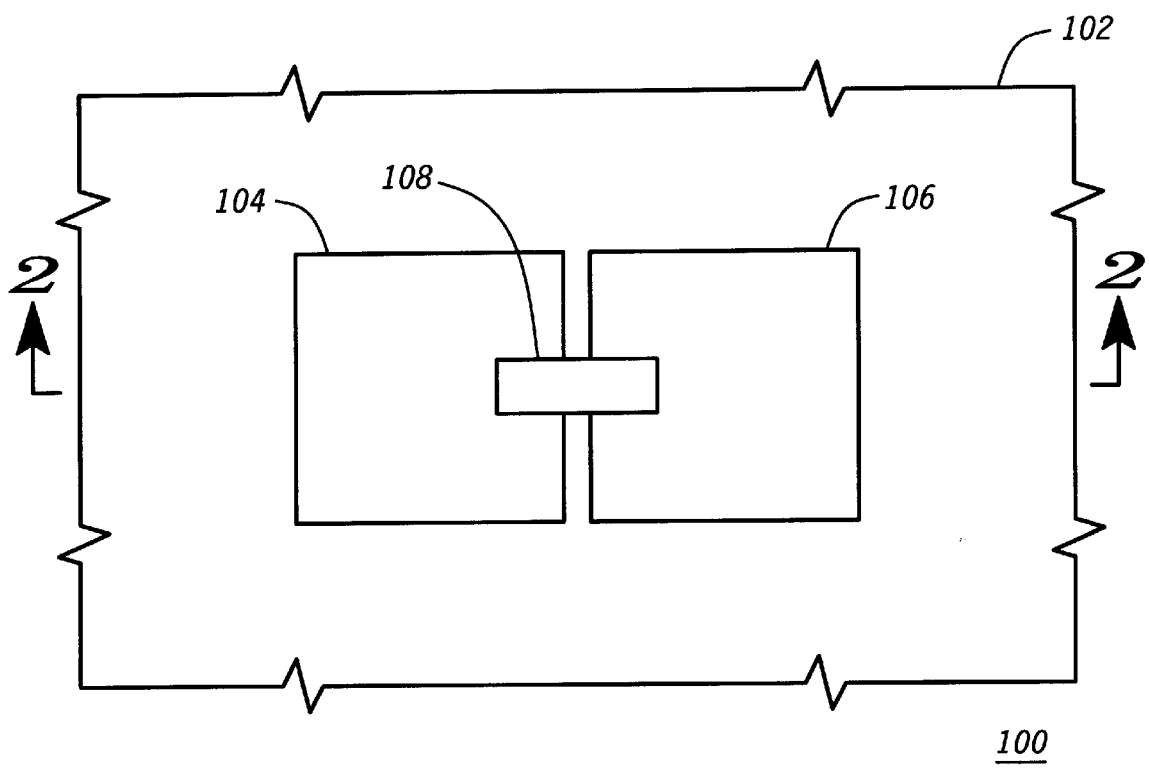
FIG. 1 is a plan view of an electronic tag assembly, in accordance with the present invention.
Figure 2:
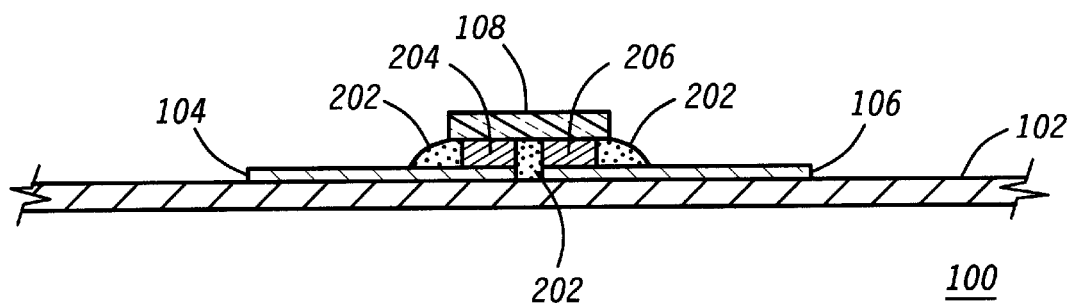
FIG. 2 is a cross-sectional view of electronic tag assembly of FIG. 1.

FIG. 1 shows a plan view and FIG. 2 shows a cross-sectional view of an electronic tag assembly 100, in accordance with the present invention. The electronic tag assembly 100 is an integrated circuit assembly that includes a chip-type part 108 having communication circuitry thereon, and an electrically coupled antenna 104, 106. The chip-type part 108 is a semiconductor die formed using a standard manufacturing process. Preferably, the die 108 has electrical interface terminals in the form of raised electrical conductors 204, 206 or bumps that function as electrical interface contacts.

In the preferred embodiment, the antenna 104, 106 is implemented on a substrate 102, preferably formed from fibrous material, such as paper or cloth, plastic, or other inexpensive material. The antenna 104, 106 is formed as a pattern of two spaced apart deposits of conductive material. Preferred conductive materials include carbon ink, carbon filled polymer, or other materials suitable for low cost applications. The conductive pattern may be printed, painted, or otherwise disposed on the substrate in a low cost manner. In the preferred embodiment, the conductive pattern and the electrical conductors are devoid of transitional elements.

The integrated circuit die 108 is adhesively affixed to the substrate 102 using an electrically non-conductive adhesive 202. The electrical interface contacts 204, 206 protrude from the integrated circuit die 108 and directly contact or interface with the conductive pattern 104, 106 on the substrate 102. The electrically non-conductive adhesive 202 is interposed between the integrated circuit die 108 and the substrate 102, and makes direct contact therewith. The adhesive 202 secures the integrated circuit die 108 to the substrate 102, and maintains electrical contact between the electrical conductors 204, 206 and the conductive pattern 104, 106.

Figure 3:
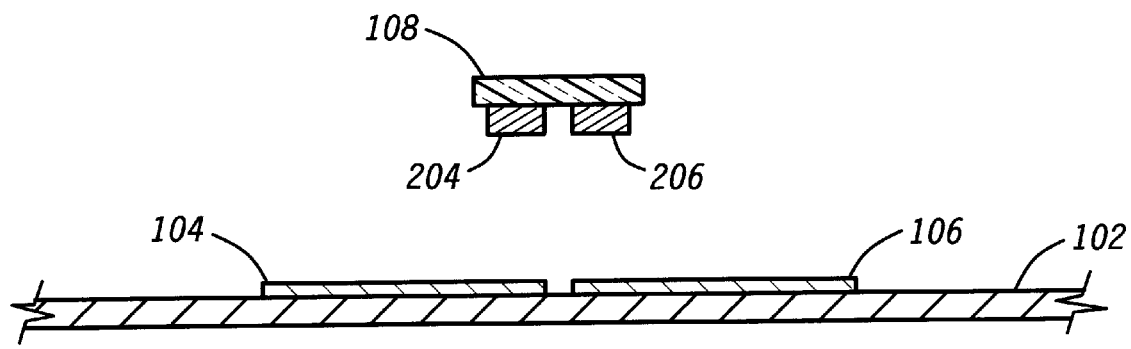
FIG. 3 shows a substrate and an integrated circuit die in a pre-assembled stage, in accordance with the present invention.
Figure 4:
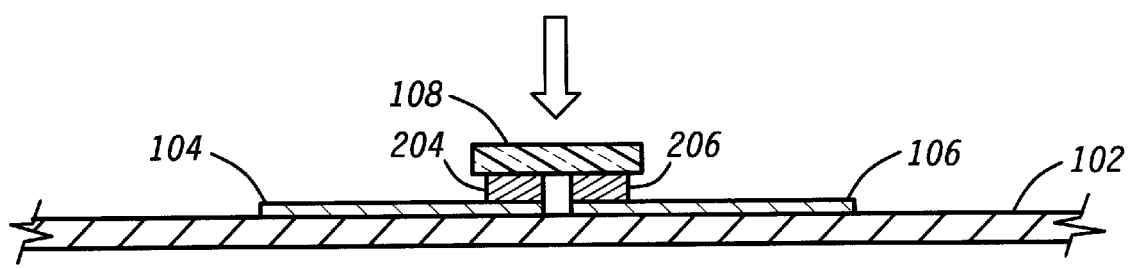
FIG. 4 shows electrical interface terminals on the integrated circuit die in contact with an antenna in the form of a conductive pattern on the substrate, in accordance with the present invention.

FIGS. 3, 4, 5, and 6 show the electronic tag assembly 100 in various stages of construction, in accordance with the present invention. With reference to FIG. 3, the antenna or conductive pattern 104, 106 is printed on or otherwise disposed on the substrate, and the integrated circuit die 108 is separately prepared, such as by using a standard manufacturing process. With reference to FIG. 4, the integrated circuit die 108 and the substrate 102 are brought together such that contact is established between the electrical conductors 204, 206 on the die 108, and the conductive pattern 104, 106 on the substrate 102. A clamping force is applied to maintain contact between the electrical conductors 204, 206 and the conductive pattern 104, 106.

Figure 5:
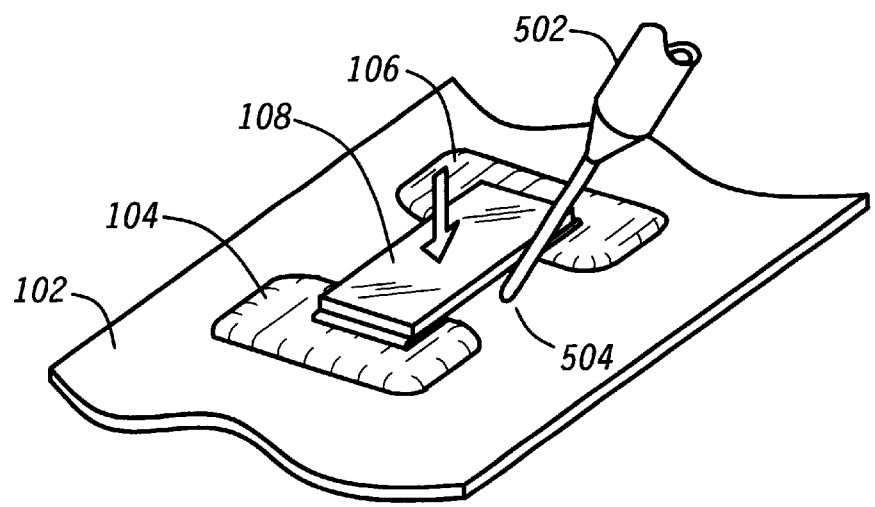
FIG. 5 shows a non-conductive adhesive being introduced in between the integrated circuit die and the substrate, in accordance with the present invention.
Figure 6:
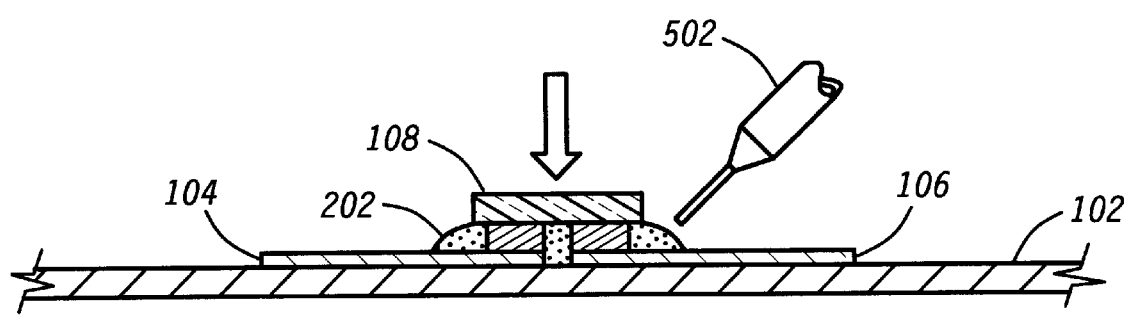
FIG. 6 shows the integrated circuit assembly in which the adhesive maintains electrical contact between the electrical interface terminals of the integrated circuit die and the conductive pattern of the substrate, in accordance with the present invention.

With reference to FIG. 5, while maintaining contact between the electrical conductors 204, 206 and conductive pattern 104, 106, and non-conductive adhesive is introduced in between the integrated circuit die 108 and the substrate 102. Preferably, the integrated circuit die 108 is held in place by the clamping force, while an adhesive dispensing needle 502 is positioned in between the die 108 and the substrate 102, and an adhesive dispensed. The clamping force is maintained while the adhesive cures. When such clamping force is removed, contact between the electrical conductors 204, 206 and the conductive pattern 104, 106 is maintained by the adhesive 602, see FIG. 6.

The present invention provides for significant advantages over the prior art. An electronic tag assembly suitable for high-volume, low-cost applications is provided without the use of expensive anistropic adhesives, and without the use of special materials and processes that add substantial expense or complexity. By establishing direct electrical contact between the integrated circuit die terminals and the antenna pattern, and by using an electrically non-conductive adhesive to maintain such contact, an inexpensive manufacturing process is provided.

What is claimed is:

1. An electronic tag assembly, comprising:
   a substrate having a conductive pattern disposed thereon;
   an integrated circuit die having electrical conductors disposed thereon, that directly interface with the conductive pattern on the substrate; and
   electrically non-conductive adhesive interposed between the substrate and the integrated circuit die that secures the integrated circuit die to the substrate and that maintains electrical contact between the electrical conductors and the conductive pattern, wherein the conductive pattern and the electrical conductors are devoid of transitional elements.

2. The electronic tag assembly of claim 1, wherein the electrical conductors comprise projections extending from the integrated circuit die.

3. The electronic tag assembly of claim 1, wherein the conductive pattern comprises conductive ink.

4. The electronic tag assembly of claim 1, wherein the electrically non-conductive adhesive directly contacts the integrated circuit die, the conductive pattern, and the electrical conductors.

5. An electronic tag, comprising:
   a substrate;
   an antenna comprising first and second spaced apart conductive patterns formed on the substrate;
   an integrated circuit die having first and second electrical conductors projecting therefrom, that directly interface with the first and second spaced apart conductive patterns, respectively; and
   electrically non-conductive adhesive interposed around the first and second electrical conductors, and on the first and second spaced apart conductive patterns, which electrically non-conductive adhesive secures the integrated circuit die to the substrate and maintains electrical contact between the first and second spaced apart conductive pattern and the first and second electrical conductors, wherein the first and second spaced apart conductive pattern and the first and second electrical conductors are devoid of transitional elements.

6. The electronic tag of claim 5, wherein the substrate is formed from fibrous material, and conductive pattern comprises conductive ink disposed thereon.

* * * * *